United States Patent
Slobodnik

(10) Patent No.: US 7,062,689 B2
(45) Date of Patent: Jun. 13, 2006

(54) METHOD AND APPARATUS FOR MEMORY SELF TESTING

(75) Inventor: Richard Slobodnik, Austin, TX (US)

(73) Assignee: ARM Limited, Cambridge (GB)

( * ) Notice: Subject to any disclaimer, the term of this patent is extended or adjusted under 35 U.S.C. 154(b) by 341 days.

(21) Appl. No.: 10/022,213

(22) Filed: Dec. 20, 2001

(65) Prior Publication Data

US 2003/0167426 A1    Sep. 4, 2003

(51) Int. Cl.
*G11C 29/00*    (2006.01)

(52) U.S. Cl. .................................... 714/718

(58) Field of Classification Search ............... 714/710, 714/711, 733, 734, 718, 720, 738, 742, 743; 365/200, 201, 49, 230.06; 711/5, 202, 203, 711/217
See application file for complete search history.

(56) References Cited

U.S. PATENT DOCUMENTS 6,469,945 B1 * 10/2002 Patti et al. ................... 365/201
2003/0167428 A1 * 9/2003 Gold .......................... 714/720

OTHER PUBLICATIONS

Synopsys; "DesignWare Memory BIST MacroCell;" 2001.

* cited by examiner

*Primary Examiner*—Guy Lamarre
*Assistant Examiner*—John J. Tabone, Jr.
(74) *Attorney, Agent, or Firm*—Nixon & Vanderhye P.C.

(57) ABSTRACT

A self-test controller for memory devices is provided with an integrated circuit. The self-test controller produces physical memory address values for driving desired memory tests. A mapping circuit serves to map these physical memory address signals to logical memory address signals as required by the particular memory devices. In this way a generic self-test controller may be provided that is able to drive tests within multiple different memory devices by providing a relatively simple mapping circuit.

8 Claims, 4 Drawing Sheets

METHOD AND APPARATUS FOR MEMORY SELF TESTING

BACKGROUND OF THE INVENTION

It is known to provide data processing systems incorporating memories with self-testing mechanisms, sometimes termed built-in self-test (BIST), such that when the memory circuits have been fabricated they may conduct a self-test or series of self-tests to determine if there are any memory defects present that would indicate that the circuit should be rejected. It is important that memory circuits should be highly reliable and that defective circuits should be effectively identified. As memory sizes increase, the proportion of the die being taken up by the memory is also increasing and, furthermore, the high transistor density within memory means that the defect density of these memories is becoming increasingly significant.

The type of defect that can arise may vary significantly from design to design fabrication processes applied to the same design. For this reason, self test methodologies are normally selected and tuned to a particular design and fabrication technique by the manufacturer concerned. A manufacturer will typically have their own preferred test methodology that experience has told them is well suited to their particular environment to identify defective memories. The test methodology adopted by one manufacturer may well not work well for another manufacturer.

It will be appreciated that self-test circuits whilst necessary to ensure a memory has been correctly fabricated, do represent a circuit area overhead that should be desirably reduced. The self-test circuits are typically used when an integrated circuit is manufactured but thereafter are not used during the normal operation of the integrated circuit.

SUMMARY OF THE INVENTION

Viewed from one aspect the present invention provides apparatus for processing data, said apparatus comprising:

at least one memory having a plurality of memory storage locations associated with respective memory addresses;

a self-test controller operable to control self-test of said at least one memory including generating physical memory address signals; and a mapping circuit operable to map said physical memory address signals generated by said self-test controller to corresponding logical address signals for use by said at least one memory to perform a memory test based upon a physical position of memory storage locations.

Providing a self-test controller that generates physical memory address signals and then using a mapping circuit to map these to logical address signals facilitates the reuse of the self-test controller. Different memories may have very different mappings between the physical memory locations (topological addresses) and the logical addresses of those locations. However, in terms of memory test methodology the physical address is much more significant than the logical address and accordingly a generic self-test controller can provide good test methodology coverage applicable to a wide variety of memory designs by generating physical memory address signals and relying upon a relatively small and easy to design mapping circuit to map those physical memory address signals to corresponding logical memory address signals as required to drive a particular memory device during test. The reuse of a self-test controller in this way is highly beneficial. In the context of system-on-chip designs that make increasing use of circuit elements designed by different sources, the mapping circuit enables a generic controller to be used more readily.

A particularly convenient way in which physical memory address signals may be represented is to use column addresses and row addresses. The generation of appropriate address sequences for addresses expressed in this way is more straight forward than with addressing structures that more abstractly represent the physical layout of the memory device.

It will be appreciated that the mapping circuit operates so as to preserve the relative physical position of memory addresses whether they are expressed in terms of physical memory address signals or logical memory address signals.

A common example of different memory devices for which different mappings may be desired is where the memory device can be one of a custom memory or a synthesizable memory.

The mapping circuit may be conveniently provided within an interface circuit disposed between a self-test controller and a memory circuit. Such an interface circuit can also adjust other signal values and signal timings as required to adapt the self-test controller to a particular memory circuit. The concentration of the customization needed for different memory devices within such an interface circuit strongly facilitates the design reuse advantages of the present technique.

The present technique is particularly well suited to embodiments in which a processor core and memories are fabricated together on a single integrated circuit. The wide variety of possible combinations that such systems provide make the reuse of a self-test controller design strongly advantageous compared with having to custom design a self-test controller for each particular circumstance.

The invention is also well suited to systems in which multiple memories are provided on a single integrated circuit. The multiple memories may have many different characteristics. As an example, a cache memory could be a custom device whereas an on-chip RAM (such as SRAM) may be synthesized. In such a situation, the two different memory devices may have greatly differing mappings between the physical position of a memory location and its logical address. In such circumstances, it is desirable to use a single self-test controller to test all of the memories and the provision of appropriate mapping circuits for each memory device allows this option.

Viewed from another aspect the present invention provides a method of testing a memory having a plurality of memory storage locations associated with respective memory addresses, said method comprising the steps of:

generating physical memory address signals; and mapping said physical memory address signals to corresponding logical address signals for use by said at least one memory to perform a memory test based upon a physical position of memory storage locations.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
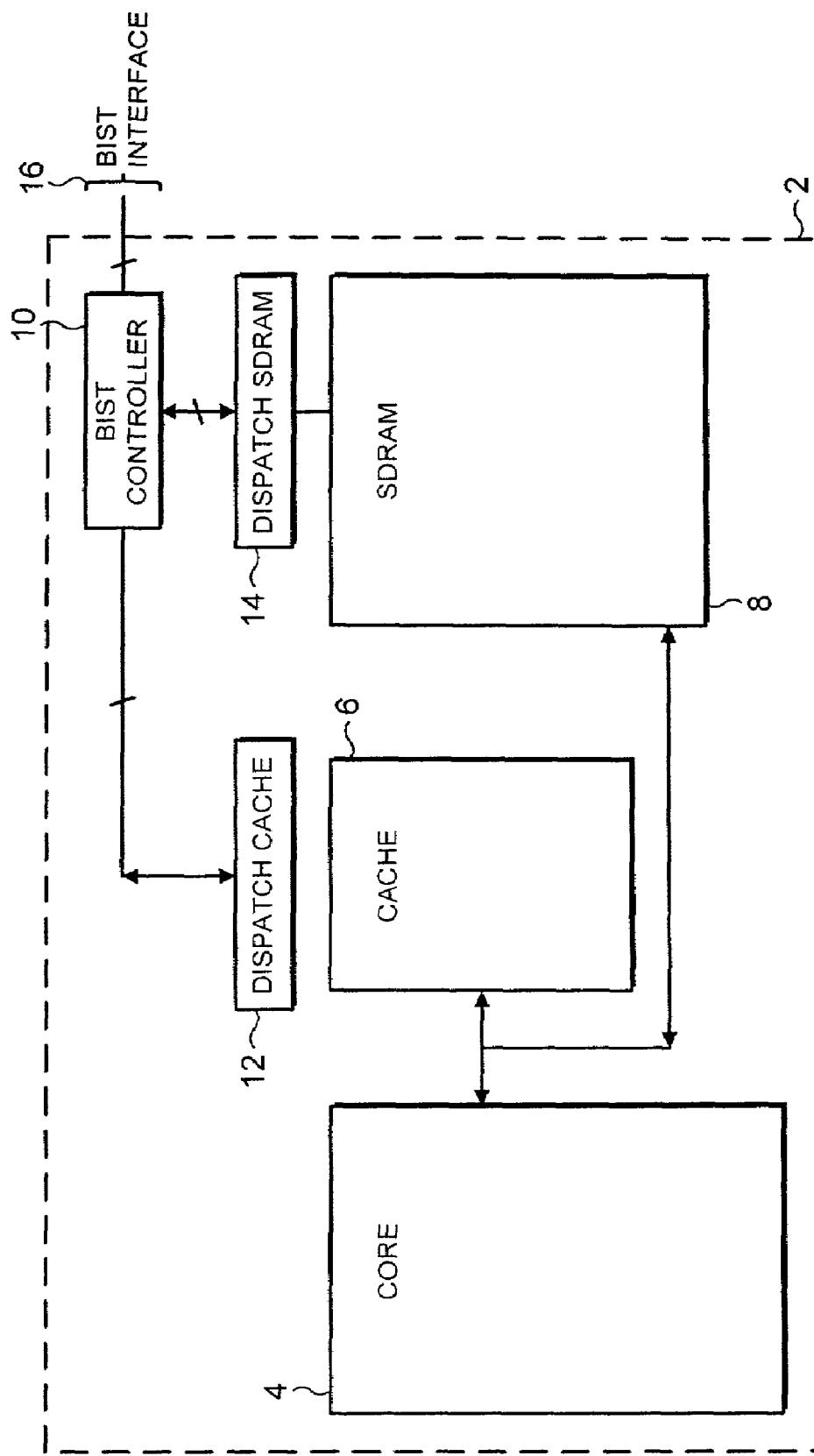
FIG. 1 schematically illustrates an integrated circuit incorporating a processor core, multiple memories and a self-test controller.

FIG. 1 shows an integrated circuit 2 incorporating a processor core 4, a cache memory 6 and an RAM memory 8 (in this example SDRAM). It will be appreciated that such an integrated circuit 2 will typically include many more circuit elements, but these have been omitted from this drawing for the sake of simplicity and clarity.

A self-test controller 10 is provided on the integrated circuit 2 and communicates with each of the cache memory 6 and the SDRAM memory 8 by a respective dispatch circuit 12, 14. These dispatch circuits act as interface circuits between the self-test controller 10 and the respective memories. Thus, generic memory test driving signals produced by the self-test controller can be re-mapped to logical addresses and adjusted in value and timing to the requirements of the different memories without a need to change the fundamental design of the self-test controller 10.

It will also be seen that the self-test controller 10 includes a self-test interface 16 provided in the form of multiple external signal pins of the integrated circuit 2. In this way, when the integrated circuit 2 has been fabricated, it may be plugged into an appropriate test controller that initiates the self-test action of the self-test controller 10 and responds to any detected memory defects by either rejecting the integrated circuit 2 as a whole or applying appropriate repairs in circuits where this is possible.

Figure 2:
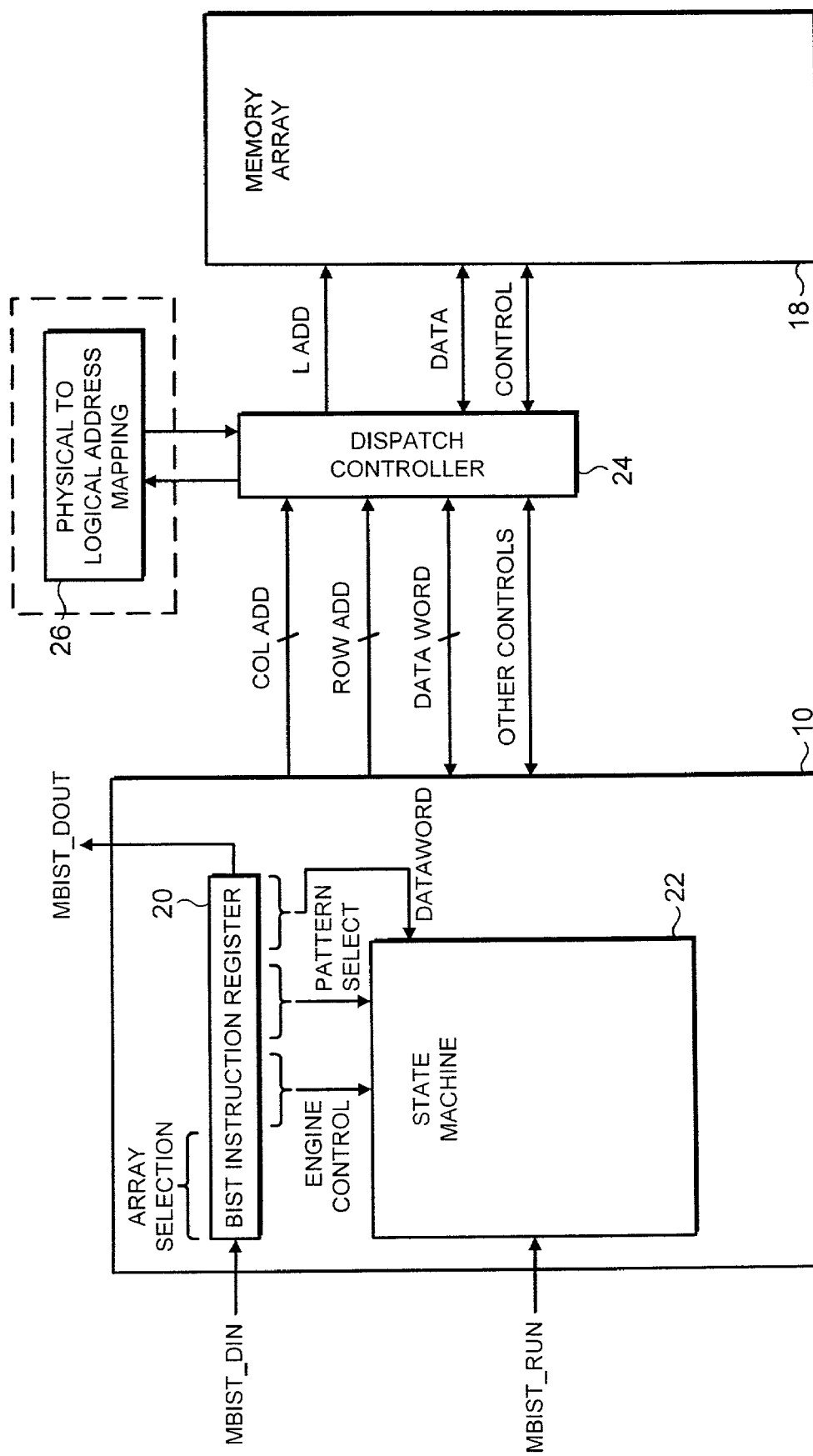
FIG. 2 schematically illustrates a self-test controller, an interface circuit and a memory in more detail.

FIG. 2 schematically illustrates the relationship between the test controller 10 and a memory device 18 in more detail. The self-test controller 10 includes a self-test instruction register 20 into which self-test instructions can be loaded via the self-test interface 16 using serial shifting techniques. Once the self-test instruction is in place, self-test action may be triggered by assertion of an appropriate externally applied signal, such as MBIST_RUN. Within the self-test controller 10 a state machine 22 is responsive to a pattern selection portion of the self-test instruction which serves to select which physical memory address sequence will be generated by the self-controller 10 for application to the memory device 18. As examples, the patterns selected may serve to perform the following actions:

write a specified data word into all entries;

read a data word from all entries;

write a data word or inverse data word in a checkerboard pattern into all entries;

read a data word or inverse data word in a checkerboard pattern from all entries;

perform a march C test (this type of test is well known in the memory test field and will not be described herein further);

perform a read operation and then a write operation using an increment decrement word line fast march;

perform a read operation and then a write operation using an increment decrement bit line fast march;

perform a read operation, a write operation and a read operation using an increment decrement word line fast march;

perform a read operation, a write operation and a read operation using an increment decrement bit line fast march;

perform a "bang" test which serves to stress test bit line pairs by repeated write operations and read operations;

perform a predefined suite of tests (such as those mentioned above) to yield a go/no go result; and perform a pattern which creates false read data at specific points in order to validate fail detection.

The data word that may be applied as part of the above described techniques is also supplied as a bit field within the self-test instruction. An engine-control field within the self-test instruction serves to define error reporting options for the self-test controller 10 and self-test system as a whole. An array selection portion of the self-test instruction serves to select which particular memory device is to be tested with the self-test instruction concerned in an environment containing multiple memory devices. It will be appreciated that a self-test instruction could be applied to multiple memory devices in parallel in appropriate circumstances.

The self-test controller 10 generates physical memory address signals in the form of column address signals and row address signals that are passed to a dispatch controller 24. The data word to be applied in the specified test is also passed to the dispatch controller 24. Various other control signals are also exchanged between the self-test controller 10 and the dispatch controller 24.

The dispatch controller 24 acts as an interface circuit for applying any necessary signal value adjustments or timing adjustments to the signals generated by the generic self-test controller 10 that are required in order to drive the desired test within the memory device 18. As an example, different latencies of signals may be accommodated by incorporating different lengths of pipeline delay between memory access instructions being received and being serviced. A further significant role of the dispatch controller 24 is to map the physical memory address signals generated by the self-test controller 10 into required logical memory address signals that may drive the memory device 18. In the case where the dispatch controller 24 has been specifically designed for the particular memory device 18, then this mapping may be incorporated into that design. In other embodiments, it may be that the dispatch controller 24 itself is generic to some degree and it is desirable to be able to deal with different mappings that may be necessary. This may be optionally accommodated by latching the physical memory address signals, supplying these to a further separately designed and provided mapping circuit 26, before the desired logical memory address signals are returned and latched within the dispatch controller 24. This separately provided mapping circuit 26 is illustrated within a dotted line within FIG. 2 to demonstrate its optional character. It will be appreciated that the mapping circuit may be separately provided in this way or may be incorporated within the dispatch controller 24. Both of these possibilities are encompassed within the present technique.

The dispatch controller 24 provides signal values necessary to drive the test within the memory device 18. These signals include a logical address value, a data value, which will typically be an expanded form of the data word as specified within the self-test instruction, and any associated control signals. The dispatch controller 24 will also monitor the response of the memory device 18 to the requested memory access operations and report detected memory defects, such as an incorrect data bit being read back, to the self-test controller 10. The dispatch controller 24 may include data registers that serve to log data specifying any detected errors or other parameters. This data may be read from the dispatch controller 24 to the outside environment using an appropriate self-test instruction scanned into the self-test controller 10 after the testing is complete. This type of operation is particularly useful in design debugging where a fine level of detail regarding detecting errors may be required.

Figure 3:
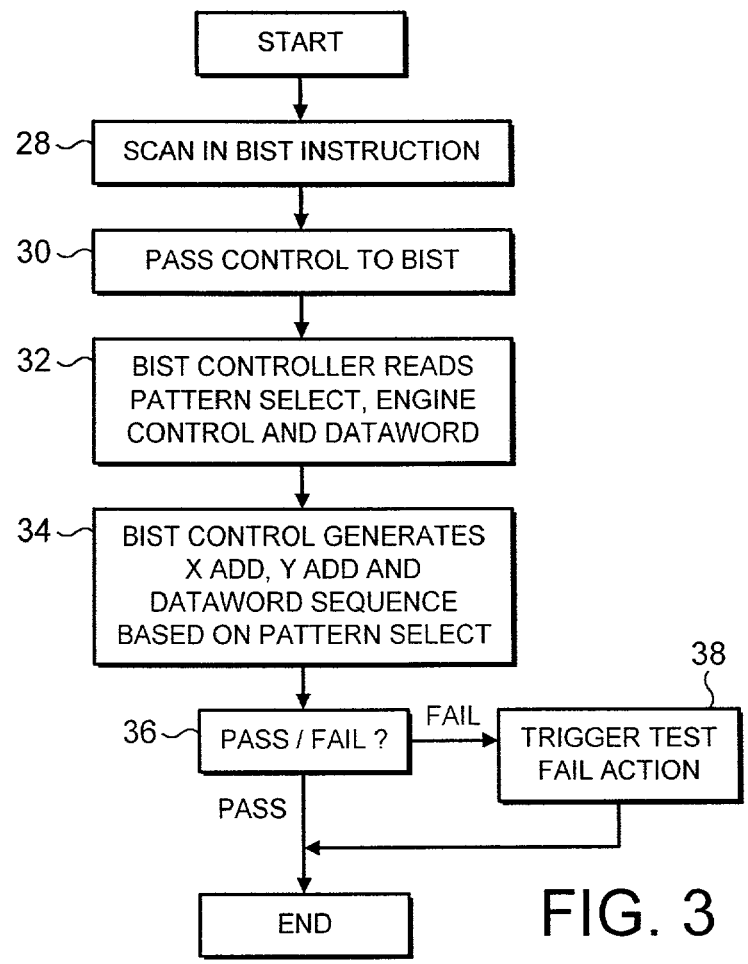
FIG. 3 is a flow diagram schematically illustrating the use of the self-test controller of FIG. 2.

FIG. 3 is a flow diagram schematically illustrating operation of the embodiments illustrated in FIGS. 1 and 2. At step 28 a self-test instruction is serially loaded into the self-test controller 10. At step 30 control is passed to the self-test controller 10 by the external application of the MBIST_RUN signal illustrated in FIG. 1. At step 32, the state machine 22 within the self-test controller reads the pattern select bits, the engine control bits and the data word bits from the self-test instruction stored within the self-test instruction register 20 and then generates the specified test signals at step 34. It will be appreciated that the self-test instruction will typically specify a long sequence generating many thousands of physical memory address signal values and data values to be applied to the memory device under test to carry out at least part of a desired test methodology.

After the particular self-test instruction has completed execution, a test at step 36 is made as to whether a pass result or a fail result has been returned. If a fail result has been returned, then processing proceeds to step 38 at which any desired fail action is triggered. If the result was a pass then the processing of the particular self-test instruction terminates directly.

It will be appreciated that the flow diagram of FIG. 3 illustrates the execution of a single self-test instruction. In practice, a test methodology will typically be built up by a manufacturer or user in the form of a long sequence of such self-test instructions as required to specify a test methodology specially adapted to that particular design and fabrication environment. Thus, multiple self-test instructions will be loaded into the self-test controller 10 and multiple passes through the processing illustrated in FIG. 3 will be made. Data retention, read disturb and iddq testing are supported to be controlling the pattern set.

It will be appreciated that some users may not wish to custom specify their own test methodology and accordingly may rely upon the default test methodology mentioned above which could be specified using a single self-test instruction and return a single simple go/no go result value.

Figure 4:
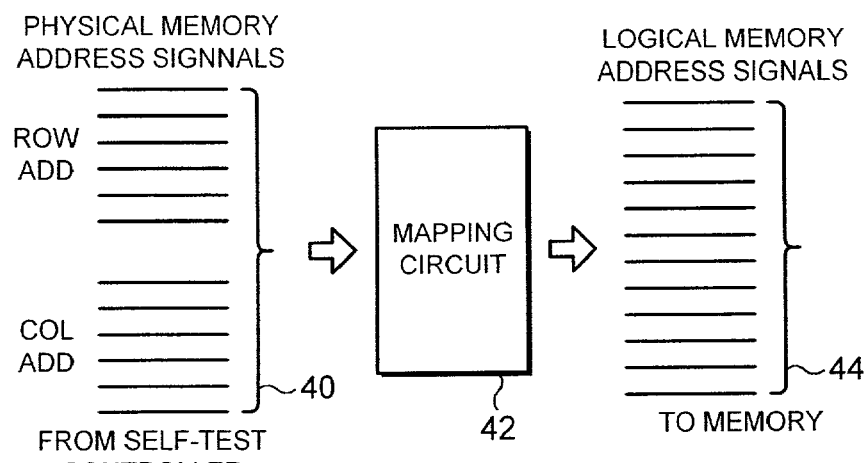
FIG. 4 schematically illustrates a mapping of physical memory address signals to logical memory address signals.

FIG. 4 illustrates the receipt of physical memory address signals 40 from the self-test controller 10. These are manipulated by a mapping circuit 42 to generate appropriate logical memory address signals 44 that can drive the memory device under test. In a simple arrangement there may be a one to one mapping of the physical memory address signals to the logical memory address signals. However, in more complicated situations the relationship between physical memory address signals and logical memory address signals may be more complex, but nevertheless readily achievable with a comparatively simple and easy to design mapping circuit 42.

Figure 5:
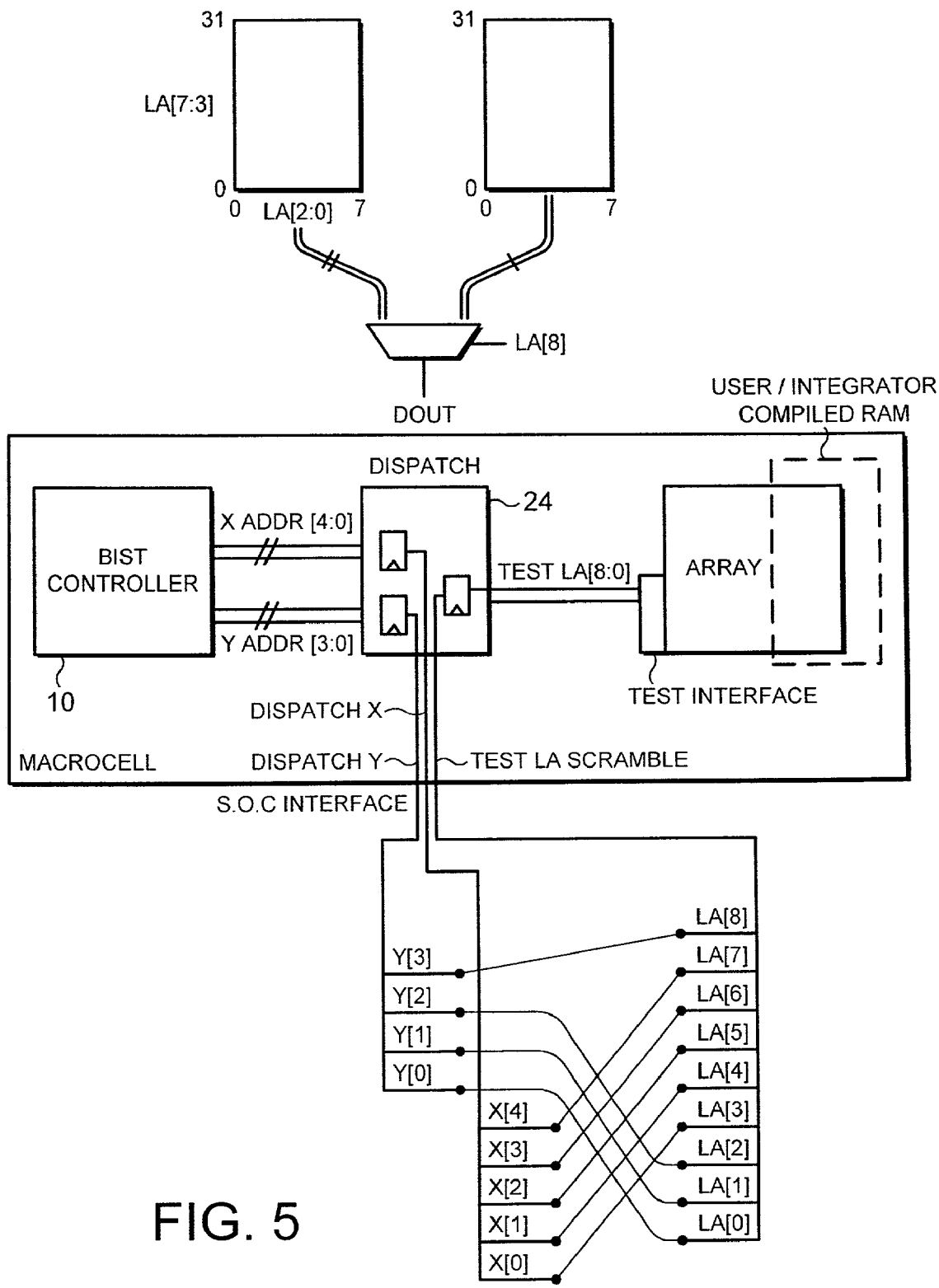
FIG. 5 illustrates in more detail a particular example of an address signal mapping that may be required.

FIG. 5 illustrates an example of an address signal mapping that may be provided. The memory device under test is formed of two memory arrays each containing 32 rows and 8 columns. The logical address is a 9-bit value. The most significant logical address bit LA[8] is used to control a multiplexer to select between the two arrays of memory. The least significant 3-bits of the logical address LA[2:0] is used to select the column. The remaining logical address bits LA[7:3] are used to select the row. This relationship and arrangement is illustrated at the top of FIG. 5.

The middle portion of FIG. 5 is similar to FIG. 2. This illustrates a macrocell which may be part of a SOC design (and have its own an SOC interface), which also includes a self-test controller 10, a dispatch controller 24 as well as the memory device formed of the two blocks as discussed above. The self-test controller 10 treats the memory device as an array of memory locations having 32 rows as represented by the 5-bit row address Xaddr. The column of the memory locations is expressed as the Yaddr 4-bit address irrespective of whether this column is in the lower order block or the higher order block within the physical device. In the example of FIG. 5 the mapping circuit is provided externally of the dispatch controller 26 via a custom circuit attached to the SOC interface. Attaching the custom mapping circuit at this level allows easy alteration to this circuit and design of this circuit. In the example illustrated, the physical memory address signals are latched within the dispatch circuit 24 and then passed out to the separate mapping circuit. Within the mapping circuit the least significant 3-bits of the Yaddr field form the least significant 3-bits of the logical address LA[2:0]. The most significant bit of the Yaddr value forms the most significant bit LA[8] of the logical address. The row address 5-bit value Xaddr forms the bits LA[7:3] of the logical address. The logical address LA [8:0] built up in this way is passed back from the mapping circuit into the dispatch controller 24 and again latched prior to being applied to the memory device to perform the desired test.

A further more detailed description of the above techniques is given as follows:

| | Contents |
|---|---|
| 1 | About this document |
| 1.1 | Change history |
| 1.2 | References |
| 1.3 | Terms and abbreviations |
| 2 | |
| 2.1 | SCOPE |
| 2.2 | Summary |
| 2.3 | MBIST Architecture |
| 2.3.1 | Summary |
| 2.3.2 | MBIST User interface (test access to BIST Ctl). |
| 2.4 | MBIST Instruction Resister |
| 2.4.1 | Array Enables and Flags <?:16> (must be in nibbles increments) |
| 2.4.2 | DataWord <3:0> |
| 2.4.3 | Pattern/Algorithm selection <9:4> |
| 2.4.3.1 | Definitions: |
| 2.4.3.2 | BIST Pattern Specification: |
| 2.4.4 | Engine Control <15:10> |
| 2.5 | MBIST Memory interface |
| 2.5.1 | Memory BIST Interface Definitions |
| 2.5.2 | MBIST Interface Design Rules |
| 2.6 | MBIST Dispatch Units |
| 2.6.1 | Dispatch Unit interface |
| 2.6.2 | Address Scrambling |
| 2.6.3 | Size Variance |
| 2.7 | Design Pilot Program |

Scope

This specification provides an outline for implementation of memory BIST in both hard and soft core products. This specification will act as a blueprint for all new designs within ARM with the end goal of creating a re-useable and constant memory BIST architecture and memory BIST interface for all customers (ARM internal included).

Summary

The memory BIST architecture will require functionality to exist in both hard and soft cores since it is ARM's desire to place memory test interfaces in non-critical paths. This access can be achieved by accessing write and read paths n pipeline stages away from the physical array. Physical mapping of arrays is required for best array test quality and soft cores will provide an address porting to allow the end user to re-configure address pins to match physical implementation once it is known.

ARM will provide an optional memory BIST controller in soft core implementations and will provide a custom implementation with hard cores (not optional). It is clear that every end customer has their own set of beliefs when it relates to memory BIST algorithms. It is ARM's goal to provide standard and custom algorithms which test for numerous fault classes and types. While these patterns may not perfectly match every end user's test methodology, they should be sufficiently robust such that the end user is not needing to create a new implementation.

There are two interfaces receiving special attention in this specification. First is the user interface. The user interface is specified with future expansion in mind. Use from core to core will remain the same, as will the primary instruction register that is loaded by this interface. This provides the same look and feel across the product line. The second interface exists at the memory access points. It is important to have a common interface among various cores to insure that the end user's own BIST solution can be configured for all future ARM cores with a common interface as well as meeting requirements for our internal BIST engine.

This document does not address specific ATPG test needs such as array bypass or controls but does include a couple of features that are required regardless of ATPG testability design style.

MBIST Architecture

Summary

ARM memory BIST strategy revolves around the ability to run testing with physically mapped arrays in order to leverage pattern effectiveness. Hard cores are always physically mapped in X (rows/distance to/from sense amp) and Y (column or sense amp selection) dimensions. Soft cores will have documented mappings of the memory test interface to the logical address provided at the core to memory interface. It will be a required exercise of the integrator (if they are to realize maximum test effectiveness) to either:

1) perform the physical mapping by scrambling the BIST_dispatch unit for each interface to match intended mapping
2) Force physical mapping in compiled rams to match the predefined ARM mapping The Memory BIST architecture will be centered around a single memory BIST test engine which distributes control signals to all arrays in the core. It is assumed that one memory BIST implementation will be created per core although it may be possible to integrate an engine across multiple cores. Providing two memory BIST engines per core is allowed but tester to memory BIST controller test interface must be managed and selected by the system integrator. Test signal distribution and routing impact is minimized by the use of a 4 bit dataword bus leaving the memory BIST controller. Dataword expansion and testing will occur at a specialized unit called mBIST_dispatch which acts as glue logic between the memory BIST controller and the memory BIST test interface. This glue logic performs address scrambling (mapping to physical space), specialized pipelining (local to targeted arrays), and dataword comparisons and test fail datalogging. This significantly reduces the excessive routing overhead usually associated with a centralized BIST controller.

The dispatch unit containing glue logic provides design specific implementations to be accommodated while enabling the memory test interface and BIST controller to be a fixed standard from design to design. End user test interface can be a standard from design to design by having a BIST controller that is off the shelf re-usable in all future ARM cores.

Memory BIST is launched by configuring the core's test interface to allow access to the memory BIST interface. Test algorithm progress (measured by address expire flags) and pass/fail status are continuously delivered on a 4 bit output only data bus (ported to macrocell). Further datalogging information can be obtained by shift access (using same external BIST interface) of the BIST controller or failing unit's dispatch unit. The amount of datalogging and trace support in the dispatch unit will be design dependent and may be configurable.

Each memory BIST interface may support multiple arrays. Each of these arrays will be supported as separate arrays in the BIST instruction register and failure log. During test execution, these arrays will also be tested by appending their enable lines to the Yaddr space. A BIST dispatch unit can accommodate mapping of enable lines to higher address bits if so enabled by the instruction register's enable lines. Note that this does not fit the usual definition of serial test or parallel test of these target arrays but the arrays are instead treated as segments of a larger whole array.

Centralized BIST controller and dispatch units:

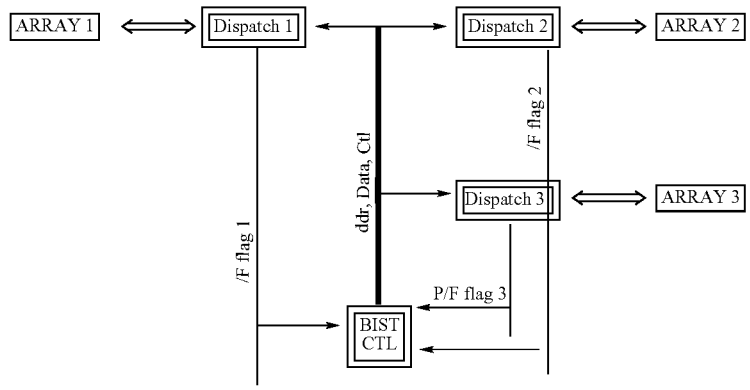

MBIST User Interface (Test Access to BIST Ctl)

The MBIST test interface is defined by the below table. Of concern is the access mechanism for shift loading of the test configuration. This shift process will be performed on the core clock domain. As cores progress into the future, this may require a pll switching mechanism to allow slow manual shift (due to tester interface limitations) and a switch to high speed pll clocking in order for memory test to occur at speed (if clock rate exceeds the tester cycle or if pad timing limitations suppress maximum clocking, speeds). It may make sense to implement a divide by four shifting clock for Jaguar in order to support future migration paths.

Test Interface to MBIST

| Core Port Signal | I/O, Size | Description |
| --- | --- | --- |
| MBIST_RUN | In | Memory testing launched by this signal |
| MBIST_SHIFT | In | Enables control register data load |
| MBIST_DIN | In | Provides serial load of control registers |
| SCANMODE | In | Disables overrides at dispatch units |
| MBIST_DOUT | Out, <3:0> | Provides runtime status <done, fail, Xexpire, Yexpire> |

The test configuration is loaded into a 32 bit register by asserting MBIST_SHIFT for 32 clocks and delivering LSB first, MSB last. MBIST_RUN MUST be inactive during this register load. Execution of register load terminates when MBIST_SHIFT is de-asserted. Assertion of MBIST_RUN will begin the memory test selected and test termination is signalled by the MBIST_DOUT<3> bit. MBIST_DOUT<1:0> will toggle during test to mark algorithm progress. MBIST_DOUT<2> or the fail bit will be sticky.

MBIST_SHIFT will be gated by MBIST_RUN to prevent unknown hazards in the engine.

MBIST_DOUT<0> doubles as the shift data out path of the instruction register whenever (MBIST_SHIFT & ~MBIST_RUN).

MBIST Instruction Register
Summary:

This portion of the instruction register also serves a second purpose. The outside user sees a single failure flag on the external interface. Scanout of this portion of the register, will reveal the P/F status of each array to further identify the failure array.

maxYaddr <23:20>

The maxYaddr field allows the user to specify the maximum Yaddr (a.k.a. column addr) to be used during test. This is especially useful when core derivatives of with varying cache sizes are employed or when different sized arrays within the core are to be tested. This bist controller architecture does not prevent multiple arrays of different sizes from being tested at the same time. To perform test of such scenarios, the user programs a maximum address size equal to the largest array and the dispatch unit blocks out of range addresses (by gating RE, WE) for the smaller array.

The following table describes the register settings and resulting address sizes:

| MaxYaddr | Size | BistYaddr active bits [11:0] |
| --- | --- | --- |
| 0000 | 0 | 000000000000 |
| 0001 | 2 | 000000000001 |
| 0010 | 4 | 000000000011 |
| 0011 | 8 | 000000000111 |
| 0100 | 16 | 000000001111 |
| 0101 | 32 | 000000011111 |
| 0110 | 64 | 000000111111 |
| 0111 | 128 | 000001111111 |
| 1000 | 256 | 000011111111 |
| 1001 | 512 | 000111111111 |
| 1010 | 1 k | 001111111111 |
| 1011 | 2 k | 011111111111 |
| 1100 | 4 k | 111111111111 |
| >1100 | — | Not supported | maxXaddr <19:16>

Similar to the Y address, the X address field slects the maximum number of addressable rows. Row depths beyond 512 are usually impractical due to bitline RC's but a space of up to 2 k is supported here if the user wishes to map planar features in the topology to the Xaddr space (we recommend

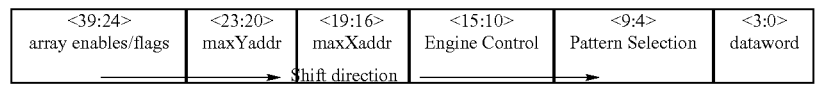

| <39:24> array enables/flags | <23:20> maxYaddr | <19:16> maxXaddr | <15:10> Engine Control | <9:4> Pattern Selection | <3:0> dataword |
| --- | --- | --- | --- | --- | --- |

Shift direction

Array Enables and Flags <39:24>

Each tested array in the core will be assigned an enable bit as specified to the TRM document. This implementation is defined in this manner to account for the desire to test all arrays in parallel and to also allow flexibility to test arrays individually should the need arise. One example is the need to test only 50% of the arrays per pass due to maximum power concerns. Another possibility may include initialising different arrays to different background patterns for use in ATPG or in iddq. An array is not defined by the number of memory test interfaces but is defined by the number of individually tested arrays (note that a single memory test interface may have multiple array enables).

that planar or block addresses be mapped on top of Y address space, else bitline stress tests based on Xaddr space may lose effectiveness).

| MaxXaddr | Size | BistXaddr active bits [10:0] |
| --- | --- | --- |
| 0000 | 0 | 00000000000 |
| 0001 | 2 | 00000000001 |
| 0010 | 4 | 00000000011 |
| 0011 | 8 | 00000000111 |
| 0100 | 16 | 00000001111 |
| 0101 | 32 | 00000011111 |
| 0110 | 64 | 00000111111 |

-continued

| MaxXaddr | Size | BistXaddr active bits [10:0] |
|----------|------|------------------------------|
| 0111 | 128 | 00001111111 |
| 1000 | 256 | 00011111111 |
| 1001 | 512 | 00111111111 |
| 1010 | 1 k | 01111111111 |
| 1011 | 2 k | 11111111111 |
| 11xx | — | Not supported |

Engine Control <15:10>

The engine control portion of the register is used to specify special state machine behaviors such as stop on error. An <15:10>=0 setting specifies default behavior.

| <15:10> | Behavior | Description |
|---------|----------|-------------|
| 00 0000 | Default | Test runs to completion |
| 1x xxxx | Real Time Fail bit | Fail bit is real time, sticky fail appears at end of test |
| xx 0001 | Stop on fail | Stops on fail with <16 cycle latency |
| xx 0010 | Stop at end of algorithm if fail | Stops on fail after current algorithm "N" is completed |
| 00 1110 | Load dispatch unit instruction | Scan dispatch unit as selected by one hot <31:16> |
| 00 1111 | Read dispatch unit datalog | Scan dispatch unit as selected by one hot <31:16> |

The real time failure bit is provided for lab use should the test/lab personnel wish to monitor soft fail behaviors.

Stop at end of algorithm pass is provided as a means to allow testing to progress until end of a failing algorithm segment. This may be useful for bitmapping if the dispatch unit provides scannable test access mechanisms for downloading all array entries.

Scanning of dispatch unit will place selected dispatch unit scan ports between MBIST_DIN and MBIST_DOUT when MBIST_RUN is asserted. Access is disabled once MBIST_RUN is de-asserted. Any operation loaded into dispatch unit will be executed at time of MBIST_RUN de-assertion. (Note: I need to better define handshake to allow maximum efficiency and also proper function as mBIST_run will require warm-up cycles and must allow enough time for the operation to complete, would probably be ok if I delayed internal override releases by appropriate cycle counts).

Dispatch units are loosely defined at this time and will be built to core's need. They should provide minimum datalogging information, such as first fail address and fail bit. This information should be accessible by the dispatch datalog scan operation. Use of scannable dispatch unit instructions is optional.

Pattern/Algorithm selection <9:4>

Numerous standard patterns and ARM created bitline stress patterns are provided for use in test. Algorithms are created in pieces to allow for maximum flexibility in unknown final test design. Areas of test supported include go/nogo, iddq, data retention, ATPG, gross function test, and stress testing. The following table describes supported patterns and later paragraphs describe their use. Use of segmented testing can be used to maximize softbin and yield tracking information in the fab and to provide the end test design to best match the fab's memory test own beliefs.

| <5:0> selection | Name | "N" | Description |
|-----------------|------|-----|-------------|
| 00000 | WriteSolids | 1 N | Write specified dataword into all entries |
| 00001 | ReadSolids | 1 N | Read dataword from all entries |
| 00010 | WriteCkbd | 1 N | Data or databar selected by X<0> ^ Y<0> |
| 00011 | ReadCkbd | 1 N | Data or databar selected by X<0> ^ Y<0> |
| 00100 | March C+ | 14 N | Increment decrement XY fast RWR march |
| 00101 | PttnFail | 6 N | Tests BIST failure detection |
| 00110 | RW_Xmarch | 6 N | Increment decrement wordline fast march |
| 00111 | RW_Ymarch | 6 N | Increment decrement bitline fast march |
| 01000 | RWR_Xmarch | 8 N | Increment decrement wordline fast march |
| 01001 | RWR_Ymarch | 8 N | Increment decrement bitline fast march |
| 01010 | Bang | 18 N | Increment decrement wordline fast bitline stress |
| 11111 | Go/No Go | 30 N | 2*W/RCkbd, RWR Ymarch, X Bang |

Definitions:

| | |
|---|---|
| column | --> dimension in array parallel to bitlines (on the same SenseAMP) |
| row | --> dimension in array parallel to wordlines |
| row fast/Xfast | --> target cell moves along bitlines before moving to next column |
| col fast/Yfast | --> target cell moves across bitline pairs before row/wordline |
| Xfast Increment | --> target cell begins nearest sense amp, moves away |
| Xfast Decrement | --> target cell begins furthest point from sense amp, moves closer |
| Yfast Increment | --> Yaddr space moves from 0 to max, east–west relationship |
| Yfast Decrement | --> Yaddr space moves from max to 0, opposite of increment |
| N | --> Number of addressable entries |

BIST Pattern Specification:

All memory BIST tests are executed against physically mapped address space. This simply means that the least significant Xaddr switches between adjacent rows (LSB+1 switches between every 2nd row, and so on). Yaddr space is also physically mapped. This allows for efficient and direct targeting of memory faults with the supplied patterns.

"writeCkbd" is performed Xfast. This pattern is 1N, writing only. Data polarity set by xor(Xaddr[0], Yaddr[0]).

"ReadCkbd" is performed Xfast. This pattern is 1N, reading only. Data polarity set by xor(Xaddr[0], Yaddr[0]).

"writeSolids" is performed Xfast. This pattern is 1N, writing only. Data polarity=true.

"ReadSolids" is performed Xfast. This pattern is 1N, reading only. Data polarity=true.

"MarchC+" is performed Xfast with the following sequence:

1) write solids (initialize array) incr
2) Rdata, Wdatabar, Rdatabar incr
3) Rdatabar, Wdata, Rdata incr
4) Rdata, Wdatabar, Rdatabar decr
5) Rdatabar, Wdata, Rdata decr
6) Rdata verify decr "RWR_Xmarch" is performed Xfast with the following sequence . . .
1) write solid (initialize array)
2) Rdata/Wdatabar/Rdatabar inc
3) Rdatabar/Wdata/Rdata decrement
4) Rdata solid "RWR_Ymarch" has the same sequence as RWR_Xmarch but is performed Yfast.

"RW_Xmarch" is performed Xfast. This 6N pattern has the following sequence . . .
1) write solid (initialize array)
2) Rdata/Wdatabar inc
3) Rdatabar/Wdata decrement
4) Rdata solid "RW_Ymarch" is 6N and performed Yfast with the same sequence as RW_Xmarch.

"pttnFail" is performed Xfast. Executes a writeSolid pattern followed by a ReadSolid. Fails are injected by reversing data polarity on select addresses during ReadSolid. This pattern is REQUIRED to insure BIST detection logic (at target array) is functional.

"bang", 18N, is performed Xfast, executing consecutive multiple writes and reads on a bitline pair.
1) write solid (initialize array)
* 2) read data target, write databar target, 6 * write databar row0, increment to next target Xfast
** 3) 5 * read databar target, write data row 0, read databar target, write data target
4) read data (verify array)

* This segment "bangs" bitline pairs insuring proper equalization after writes. Insufficient equalization/precharge will result in a slow read when opposite data is read from the same bitline pair. Slow reads in self timed caches result in functional failure not found in popular "single shot" algorithms like March C.

** This segment attempts to walk down a bitcell, write opposite data on that bitline pair, read target cell data. This failure mechanism is less common in 6T ram cells (vs. 4T or DRAM).

*,** Use of the "sacrificial" row, also helps detect open decoder faults in the Xaddr space (Yaddr not subject to fault class architecturally because of smaller decode blocks) in absence of graycode pattern sequences.

*,** This pattern does detect stuck at fault, but its primary intent is to address the memories' analog characteristics.

"go/nogo", 30N is the ARM test suite selected for memory tests should the end user not desire to implement their own test strategy. Selection of this pattern will result in the following tests to be executed as listed below. This provides the end user a pass fail status for the array. The below test suite provides a comprehensive functional test of the arrays (data retention and other stress tests not included). The series of tests in gonogo are the culmination of internal ARM memory test engineers' past experiences in memory test.
1) Perform wckbd 5's
2) Rckbd 5's
3) Wckbd a's
4) Rckbd a's
5) RWR_Ymarch 6's
6) Bang 0's DataWord <3:0>
At test instruction load, the user specifies the root dataword used during the test algorithm (exception during go/nogo BIST algorithm). This allows the user to select values stored into initialised arrays (iddq or ATPG) or to select new datawords to search for unexpected sensitivities during march and bitline stress tests.

MBIST Memory Interface

The memory interface is defined in the below table. Its use is required for all memory devices on a core, regardless of whether or not ARM provides the memory for that core. This will allow the user to make use of the ARM BIST controller without special modifications. ATPG related support is also defined here.

| Signal | I/O . Size | Description |
| --- | --- | --- |
| MTestSel | In, <?:0> | Optional, Used for serial test of multiple downstream arrays |
| MTestWEx | In | Dictates write operation |
| MTestREx | In | Dictates read operation |
| MTestADDR* | In, <maxAddr:0> | Target Address |
| MTestDINx | In, <datawidth:0> | BIST Write Data |
| MTestDOUTy | Out, <datawidth:0> | BIST read Data |
| MTestON | In | Global Override of cache logic |
| ArrayDisable | In | Blocks all array activity, regardless of operation mode |

*May have single Address bus if mBIST_dispatch handles all scrambling concerns. This is still being thought out.

Memory BIST Interface Definitions

"MTestSel<?:0>"

Should a memory BIST interface support more than one downstream array, separate enables are required to select array being targeted. This signal may also be required for a single array that has multiple repairable areas. A single array interface does not require use or porting of this signal.

"MTestWEx"

This signal (if not blocked internally by MTestSel or MTestON) indicates a write operation is being delivered to the memory test array interface. Address and Data information will be delivered coincident with this signal. If a write operation takes two cycles to complete, this signal is designated "MTestWE2". If multiple arrays are supported by the interface, all with varying pipeline delays, the x designation shall be used ("MTestWEx"). Use of the pipeline delay length in the signal name allows for easier BIST integration by the BIST interface unit or end users own implementation.

"MTestREx"

Read enable for array under test. See MTestWEx signal for further information.

"MTestADDR<?:0>*"

Address being targeted in array under test. Signal is as wide as maximum number of addressable elements in targeted arrays.

* May have single Address bus if mBIST_dispatch handles all scrambling concerns. This is still being thought out.

"MTestDINx, MTestDOUTy"

Data in and data out ports for BIST operations. MBISTDOUT delivered "x+y" cycles later as defined by MBISTREx. Example: An MBISTRE3 specifies that the read operation will occur 3 clocks after MBISTRE3 information is asserted. The dataout pipeline may have its own offset and is represented by "y". If multiple arrays are supported by a single interface, and some arrays have smaller data widths than the maximum array width, the memory BIST interface shall be required to deliver "0" on all unused data bits for all read operations. If datain and dataout busses have varying pipeline offsets depending on downstream array, they shall have an offset designated by "x".

"MTestON"

This is a global override signal, informing the interface and downstream logic that BIST operations are imminent. This signal is the second highest priority signal in cache logic, behind ScanMode/ScanEn. Normal function/mission mode operation is a LOWER priority operation.

"ArrayDisable"

ATPG signal, blocking writes and reads to all arrays whenever active. Blocking must occur after all scannable state elements to insure safety of array's initialized data. This signal is generated in the memory BIST dispatch unit and is the "or'd" function of IDDQtest and ScanEn. IDDQtest used to insure preservation of state during iddq scan and capture, scanEn used to preserve state during ATPG load/unload should ATPG ram tests be implemented.

MBIST Interface Design Rules

MTestON overrides all normal function operations.

MTestON is asserted at least 4 cycles prior to first operation and not released until after last operation completes. Remains static "on" for duration of BIST test.

ArrayDisable blocks all write/read activity, regardless of device mode (functional, ATPG, BIST, etc.) and occurs after last scannable state elements.

A BIST no-op (no operation) can and will occur. Defined as BIST cycle where RE/WE are both inactive Back to back operations must be supported and expected in any combination of R/W/Addr All operation data provided from F/F's and read data will be sampled into F/F's. (mBIST is a flop based design)

All BIST operations can occur at full speed.

Addr and RE/WE signals are provided in same clock cycle. DataIn may be injected at different stage if required.

All RE/WE/Data signals must have cycle suffix designator as specified in signal descriptions.

All read operations must be completed within 8 cycles from RE assertion to dataout. (pipeline injection points must be reasonable).

If multiple arrays are supported by interface, address and data adjustments will occur in dispatch unit (example: addressed array is smaller than BIST_engine . . . BIST_dispatch will block RE/WE for out of range addresses)

All Variable sized arrays must be right justified in addressing wrt to incoming BISTADDR where rightmost bit is LSB.

ONLY ArrayDisable and MTestON can be assumed to toggle without regard to operation setup/hold times. All other control signals at interface must be considered unknown from cycle to cycle.

No address scrambling allowed between mBIST interface and actual array interface. Scrambling will occur in the dispatch unit.

Physical mapping characteristics must be maintained on all arrays downstream of each unique array interface. (Xaddr LSB always selects between adjacent rows regardless of array supported by gi9ven interface).

MBIST Dispatch Units

A dispatch unit is required between every BIST controller to memory test interface. This block serves as glue logic between a standardized front end BIST controller and a standardized memory test interface. It also provides manual debug accesses to the array and performs data compare and datalogging of the read data from the test interface.

Dispatch Unit interface

The following table describes the incoming and outgoing interface signals of the mBIST_dispatch unit:

| Input/O Data from Memory BIST controller | | I/Output to memory test interface | |
|---|---|---|---|
| Signal | Description | Signal | Description |
| ArrayEn<?:0> | Enables target arrays (instr reg) | MTestSel | Array enables to interface |
| BISTTest | Game on | MTestWEx | Array write enable |
| MBISTData<3:0> | Write/read data | MTestREx | Array Read Enable |
| MBISTXaddr<?:0> | BIST Controller Wordline Addr | MTestADDR* | Array cell select |
| MBISTYaddr<?:0> | BIST Controller bitline Addr | | |
| MBISTWE | BIST Controller write enable | MTestDINx | Array Data in (full width) |
| MBISTRE | BIST Controller read enable | MTestDOUTy | Array Data out (full width) |
| MBISTShiftI | Shiftenable for dispatch instr | MTestON | Array test override |
| MBISTShiftD | Shiftenable for datalog | ArrayDisable | Array access blocking |
| DispatchDin | Shift data in | | |
| DispatchDout | Shift data out | | |
| IddqTest | IddqTest mode | | |
| SE | Scan enable input | | |
| SCANMODE | ATPG testing mode | | |
| MBISTFail<?:0> | Fail bits sent to main controller | | |

Notes:
1. BISTData<3:0> is linearly expanded across full memory bit width. Pipelining of this data inside of dispatch unit is done as <3:0> and expanded as needed. This expanded word is used to drive or compare the full bus width of the memory under test.
2. DispatchDout follows LSB of dispatch unit's instr or datalog register (as selected by shiftenable)
3. The memory test interface shall be driven by the dispatch unit and ONLY the dispatch unit for all defined signals (no direct connect to BIST controller as dispatch unit pipelines controller data for timing safety).
4. Support of instruction register capability inside dispatch is design specific. Datalogging/Repair information is generated and maintained in dispatch unit and is design implementation specific.
5. Multiple enable selected arrays can be tested simultaneously by mapping enables to higher order Yaddress. This is highly desirable for go/nogo testing.

Address Scrambling

Hard cores will have known physical to logical mapping of address spaces and will need to be scrambled accordingly in the BIST_dispatch unit. This is performed at the dispatch unit as address scrambling requirements may differ for different memory test interfaces.

Softcores and compiled rams will not have known addressing up front and scrambling cannot be performed in rtl, especially if the core design is synthesized prior to compilation of memories. Scrambling will be required to insure physical mapping exists with the ARM BIST algorithms. This is accomplished by adding 2 additional ports of the TestADDR to the dispatch unit. These ports represent the BIST controller address and the second represents the scrambled version of address going to the MtestAddr interface. These ports are brought up to the highest hardened level of the design and scrambling occurs by stitching the controller address to the test address as required. This stitching becomes the responsibility of the core integrator.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for processing data, said apparatus comprising:
    a plurality of different memories, each having a plurality of memory storage locations associated with respective memory addresses, said plurality of different memories having different mappings between physical memory locations and logical addresses associated with said physical memory locations;
    a self-test controller operable to control self-test of said plurality of different memories including generating physical memory address signals; and
    a plurality of mapping circuits, each of said plurality of mapping circuits corresponding to a respective one of said plurality of different memories and being operable to map said physical memory address signals generated by said self-test controller to corresponding logical address signals for use by said a respective one of said plurality of different memories to perform a memory test based upon a physical position of said plurality of memory storage locations; and
    a processor core,
    wherein said processor core, said plurality of different memories and said self-test controller are formed together on an integrated circuit, and
    wherein each of said plurality of mapping circuits is part of an interface circuit disposed between said self-test controller and said plurality of different memories, said interface circuit being operable to adapt values and timings of signals passed between said self-test controller and said plurality of different memories to accommodate differing value and timing properties of said plurality of different memories.

2. Apparatus as claimed in claim 1, wherein said physical memory address signals include row address signals and column address signals for addressing one of said plurality of different memories having a row and column layout.

3. Apparatus as claimed in claim 1, wherein said mapping circuit is operable to map first physical memory address signals addressing a first memory location and second physical memory address signals addressing a second memory location to first logical address signals addressing said first memory location and second logical address signals addressing said second memory location respectively such that a memory test being performed by said self-test controller and based upon relative physical position of said first memory location and said second memory location still operates when one of said plurality of different memories is addressed with said logical address signals.

4. Apparatus as claimed in claim 1, wherein at least one of said plurality of different memories is a synthesized memory or a custom memory.

5. A method of testing a plurality of different memories of a data processing apparatus having a processor core, each of said plurality of different memories having a plurality of memory storage locations associated with respective memory addresses, said plurality of different memories having different mappings between physical memory locations and logical addresses associated with said physical memory locations said method comprising the steps of:
    generating physical memory address signals using a self-test controller; and
    mapping, for each of said plurality of different memories being tested, said physical memory address signals to corresponding logical address signals for use by a respective one of said plurality of different memories to perform a memory test based upon a physical position of said plurality of memory storage locations,
    wherein the processor core, said plurality of different memories, and said self-test controller are formed together on an integrated circuit, and
    wherein values and timings of signals passed to each of said plurality of different memories are adapted to accommodate differing value and timing properties of said plurality of different memories.

6. A method as claimed in claim 5, wherein said physical memory address signals include row address signals and column address signals for addressing one of said plurality of different memories having a row and column layout.

7. A method as claimed in claim 5, wherein first physical memory address signals addressing a first memory location and second physical memory address signals addressing a second memory location are mapped to first logical address signals addressing said first memory location and second logical address signals addressing said second memory location respectively such that a memory test being performed based upon relative physical position of said first memory location and said second memory location still operates one of said plurality of different memories is addressed with said logical address signals.

8. A method as claimed in claim 5, wherein at least one of said plurality of different memories is a synthesized memory or a custom memory.

* * * * *